(12) United States Patent
Takata

(10) Patent No.: US 6,777,738 B2
(45) Date of Patent: Aug. 17, 2004

(54) SEMICONDUCTOR INTEGRATED CIRCUIT

(75) Inventor: Yoshifumi Takata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/441,784

(22) Filed: Nov. 17, 1999

(65) Prior Publication Data

US 2002/0140017 A1 Oct. 3, 2002

(30) Foreign Application Priority Data

Jun. 9, 1999 (JP) .............................. 11-162831

(51) Int. Cl.[7] .................. H01L 27/108; H01L 29/76; H01L 29/94; H01L 31/119; H01L 23/48; H01L 23/52; H01L 29/40
(52) U.S. Cl. ................. 257/306; 257/750; 257/758
(58) Field of Search ................. 257/295–310, 257/750–761, 773–775; 438/396–398, 253–254

(56) References Cited

U.S. PATENT DOCUMENTS 5,091,768 A * 2/1992 Yamazaki .................. 257/774
5,374,849 A * 12/1994 Tada ......................... 257/751
5,808,365 A * 9/1998 Mori ......................... 257/775
6,002,175 A * 12/1999 Maekawa ................... 257/760
6,300,683 B1 * 10/2001 Nagasaka et al. .......... 257/774

FOREIGN PATENT DOCUMENTS

| JP | 6-151388 | 5/1994 |
| JP | 7-99194 | 4/1995 |
| JP | 7-288244 | 10/1995 |
| JP | 9-167797 | 6/1997 |

* cited by examiner

Primary Examiner—Cuong Nguyen
(74) Attorney, Agent, or Firm—McDermott Will & Emery LLP

(57) ABSTRACT

A semiconductor integrated circuit is formed with a contact hole through first and second interlayer insulating films. The contact hole contains first and second high melting point metals forming a plug forming a recess below an upper surface of the second interlayer insulating film. An interconnection layer is formed in electrical connection with the metal plug. In an embodiment of the present invention, the second insulating film has a thickness greater than the depth of the recess. In another embodiment of the present invention, the contact hole increases in diameter toward the upper surface of the second insulating film thereby enhancing filling of the contact hole with the first and second metals.

5 Claims, 9 Drawing Sheets

SEMICONDUCTOR INTEGRATED CIRCUIT

BACKGROUND OF THE INVENTION

1. Field of the Invention

The present invention generally relates to a semiconductor integrated circuit and a manufacturing method thereof, and particularly to a semiconductor integrated circuit including a conductive plug in a contact hole formed in an insulating film provided on a substrate and a manufacturing method thereof.

2. Description of the Background Art

With the increased level of integrated of a semiconductor integrated circuit, the width of an interconnection wiring and the size of a contact hole have been reduced. A method has been known for connecting a lower interconnection layer or a semiconductor substrate to an upper interconnection layer via a contact hole, wherein a metal film is formed in the contact hole by sputtering. However, it is difficult to form such a metal film in a fine contact hole with a sufficient coverage by sputtering. For a semiconductor integrated circuit including a fine contact hole, therefore, a plug technique has been generally used in which a high melting point metal film made from tungsten (W) or the like is formed in a wide region containing the contact hole by CVD and then a metal film is selectively formed in the contact hole by etching-back.

A related art method of manufacturing a semiconductor integrated circuit using the above plug technique will be described below with reference to FIGS. 10 to 16. In these figures, like or corresponding parts are designated by like reference numerals and explanation thereof is omitted.

In accordance with the related art manufacturing method, as shown in FIG. 10, oxide isolation regions 2, a gate electrode 3 and source/drain regions 4 of each transistor, and a first interlayer insulating film 5 are formed in or on a semiconductor substrate 1. A first contact hole 6 communicated to one source/drain region 4 is formed in the first interlayer insulating film 5. A metal film is formed on the surface of the first interlayer insulating film 5 in such a manner as to fill the first contact hole 6. The metal film is then patterned by photolithography and etching, to form a first interconnection layer 7.

Referring to FIG. 11, a second interlayer insulating film 8 is formed in such a manner as to cover the first interconnection layer 7. A second contact hole 9 is formed in such a manner as to be opened to the other source/drain region 4 through the second interlayer insulating film 8. A polysilicon layer is formed over the entire surface of the semiconductor substrate 1, and patterned by photolithography and etching to form a charge storage node 10 (hereinafter, referred to as "storage node 10").

A third insulating film 11 is thinly formed in such a manner as to cover the storage node 10. Then, a polysilicon layer is formed again on the third insulating film 11. The polysilicon layer is patterned by photolithography and etching, to form an upper electrode 12 for storage of charges (hereinafter, referred to as "cell plate 12"). The storage node 10, the third insulating film 11, and the cell plate 12 constitute a capacitor functioning as a memory cell.

The amount of charges allowed to be stored in the capacitor is proportional to the surface area of the storage node 10, and inversely proportional to the thickness of the third insulating film 11. As the device structure becomes finer, the area on the substrate which is allocated to the storage node 10 becomes smaller. Accordingly, in general, to ensure the necessary charges allowed to be stored in the capacitor, the thickness of the third insulating film 11 is made thin and the height of the storage node 10 is made large.

Referring to FIG. 12, a fourth interlayer insulating film 13 and a fifth interlayer insulating film 14 are sequentially formed over the entire surface of the semiconductor substrate 1 in such a manner as to cover the cell plate 12. The first, second, fourth and fifth interlayer insulating films 5, 8, 13 and 14 are selectively removed by photolithography and etching, to form a third contact hole 15 which is opened through the above films to the source/drain region 4 of a transistor separated from the above transistor by the oxide isolation region 2.

The region on the semiconductor substrate 1 is separated into a capacitor region in which the capacitor is to be formed (hereinafter, referred to as "memory cell region") and a peripheral circuit region in which a peripheral circuit is to be formed. A surface stepped portion stemming from the storage node 10 is formed between the memory cell region and the peripheral circuit region. If the surface stepped portion is larger than the focal depth upon photolithography, a failure in resolution of a resist pattern may easily occur. Also upon etching of high melting point metal films to be described later, as the surface stepped portion becomes larger, an etching residue remains easier on the stepped portion, leading to an electric short-circuit failure. Further, as the height of the storage node 10 becomes larger, the problem due to the surface stepped portion becomes more serious.

To suppress occurrence of the above-described problem, the fourth interlayer insulating film 13 is usually configured as a BPSG (Boro-Phospho Silicate Glass) film. BPSG film has a property that being softened and planarized at a high temperature of 800° C. or more to make the surface thereof into a smooth flow shape. The use of the BPSG film as the interlayer insulating film is effective to easily suppress the surface stepped portion of the device. The planarization characteristic of the BPSG film is dependent on the concentrations of boron (B) and phosphorus (P). To be more specific, as the concentrations of B and P become higher, the planarization characteristic of the BPSG film becomes more desirable.

The quality of the BPSG film containing B and P at high concentrations is generally unstable, and more specifically, it is liable to be changed depending on moisture absorption and the like. Further, since the BPSG film is poor in adhesion with a resist used for photolithography, there occurs a problem that when a resist pattern is directly formed on the BPSG film, the resist pattern may be peeled therefrom. For this reason, as described above, the insulating film having the double layer structure of the fourth interlayer insulating film (BPSG film) 13 for ensuring planarization between the memory cell region and the peripheral circuit region and the fifth interlayer insulating film 14 formed on the fourth interlayer insulating film 13 to a thickness ranging from several tens to several hundreds nm is provided on the cell plate 12.

After removal of the resist pattern used as a mask upon selective etching for forming the third contact hole 15, the semiconductor substrate 1 is generally subjected to wet cleaning using a $NH_4OH/H_2O_2$ solution or the like for removing foreign matters remaining on the wafer surface. At this time, the surface of the fifth interlayer insulating film 14 is etched to about several tens nm and also a portion, exposed as the inner wall of the third contact hole 15, of the fourth interlayer insulating film 13 is etched.

Upon etching using the $NH_4OH/H_2O_2$ solution for wet cleaning, the etching rate for the fourth interlayer insulating film 13 containing B and P is larger than that for the fifth interlayer insulating film 14. Accordingly, by the above-described wet cleaning, irregularities shown in FIG. 12 are formed on the inner wall of the third contact hole 15. The irregularities formed on the inner wall of the contact hole 15 can be somewhat suppressed by shortening the cleaning time; however, if the cleaning time is shortened, there occurs a problem in degrading the effect of removing foreign matters thereby reducing the manufacturing yield.

Referring to FIG. 13, a first high melting point metal film 16 is formed by sputtering or the like in such a manner as to cover the inner wall of the third contact hole 15 and the surface of the fifth interlayer insulating film 14. Then a second high melting point metal film 17 is formed on the first high melting point metal film 16 by CVD or the like. The first and second high melting point metal films 16 and 17 deposited on the fifth interlayer insulating film 14 are removed by RIE (Reactive Ion Etching) to form a metal plug 18 composed of the first and second high melting point metal films 16 and 17 only in the third contact hole 15. Each of the first and second high melting point metal films 16 and 17 may be made from titanium (Ti) or W, or a nitride or silicate thereof.

FIGS. 14 and 15 are views each showing, on a large scale, an opening end portion of the third contact hole 15. Specifically, FIG. 14 shows a state in which the first and second high melting point metal films 16 and 17 remain on the fifth interlayer insulating film 14. FIG. 15 shows a state after the first and second high melting point metal films 16 and 17 are removed from the fifth interlayer insulating film 14.

As shown in FIG. 14, at the opening end portion of the third contact hole 15, a diameter of the opening formed in the fourth interlayer insulating film 13 is larger than a diameter ($2t_1$) of the opening formed in the fifth interlayer insulating film 14. In other words, at the opening end portion of the third contact hole 15, the fifth interlayer insulating film 14 is protruded from the wall surface of the fourth interlayer insulating film 13 by a specific length. In the case where the first high melting point metal film 16 is formed by sputtering under such a situation, since the formation of the metal film is blocked right under the fifth interlayer insulating film 14, a portion near the upper end of the fourth interlayer insulating film 13 is not covered with the first high melting point metal film 16.

When there exist the portion not covered with the first high melting point metal film 16 on the inner wall of the third contact hole 15 as well as the portion covered therewith, a local stress is liable to be applied to the second high melting point metal film 17 which is formed on the above portions. As a result, if the portion not covered with the first high melting point metal film 16 is present, the second high melting point metal film 17 may be easily peeled due to the above-described local stress. This causes a problem in degrading the yield of the device.

Further, upon formation of the second high melting point metal film 17 under the condition shown in FIG. 14, when the thickness of the second high melting point metal film 17 reaches the value $t_1$, the opening end portion of the third contact hole 15 is blocked. This causes a problem that although the second high melting point metal film 17 can be formed on the flat portion on the substrate to a normal thickness $t_{17}$ ($>t_1$), it cannot be formed on the inner wall of the contact hole 15 to a thickness of $t_1$ or more. In this case, a cavity remains in the third contact hole 15 at a position right under the protruded portion of the fifth interlayer insulating film 14.

As shown in FIG. 15, the cavity remaining in the third contact hole 15 is exposed by etched-back the second high melting point metal film 17 and thereby formed a depressing (called "a recess" and assumed the thickness to be "h" hereunder) at the upper end of the third contact hole 15. During a removal of the first and second high melting point metal films 16 and 17, the necessary over-etch amount becomes larger as the planarization of the wafer is poorer. Accordingly, as the planarization of the wafer mainly depending on the planarization of the fourth interlayer insulating film 13 is poorer, the depth "h" of the recess becomes larger, with a result that the cavity in the contact hole is easier to be exposed.

Referring to FIG. 16, a metal film 19 is formed in such a manner as to cover the fifth interlayer insulating film 14 and the metal plug 18. The metal film 19 is usually made from an aluminum alloy such as AlSi, AlSiCu or AlCu. Such an aluminum alloy having a high reflectance is easy to cause halation upon photolithography, and therefore, an anti-reflection film 20 is formed on the metal film 19. The anti-reflection film 20 is generally made from a high melting point metal such as TiW, WSi, MoSi, TiW or W, or a compound thereof. The anti-reflection film 20 plays a role of not only reducing the reflectance of the surface of the metal film 19 but also reinforcing the mechanical strength of the metal film 19 thereby enhancing the reliability of the device.

The metal film 19 and the anti-reflection film 20 are patterned by photolithography and etching, to form a second interconnection layer 21. After formation of the second interconnection layer 21, the semiconductor substrate is subjected to cleaning treatment using a solvent containing ammonium fluoride or an amine based solvent.

Since the metal film 19 is not formed on the cavity portion of the metal plug 18, the cavity portion is left exposed after the second interconnection layer 21 is formed. As a result, the solvent used for the above cleaning treatment deeply permeates in the metal plug 18. If the solvent is not sufficiently cleaned and remains in the metal plug 18, the second high melting point metal film 17 and the metal film 19 may be corroded by the solvent. With progress of such corrosion, an electrical open failure may occur, giving rise to a problem that the semiconductor integrated circuit is not normally operated.

As described above, the conventional semiconductor integrated circuit has disadvantages in degrading the yield resulting from the irregularities formed on the inner wall of the contact hole, that is, degrading the yield by peeling of the film upon formation of the metal plug, and causing an electrical open failure resulting from formation of a cavity in the metal plug.

A method including a step for carrying out CMP (Chemical Mechanical Polishing) after formation of a conductive layer has been known as a method for forming a metal plug in a contact hole, as illustratively disclosed in Japanese Patent Laid-open Nos. Hei 7-288244 and Hei 9-167797. The method of forming a metal plug by using CMP can reduce the size of the above-described recess, thereby avoiding the above problems caused upon formation of a metal plug by using RIE.

To carry out CMP in manufacture of a semiconductor integrated circuit, however, it is required to newly prepare a polishing apparatus for CMP and a cleaning apparatus for cleaning a wafer after polishing. Also, to form a metal plug by CMP, the surface of an insulating film in which a contact hole is to be formed must be previously planarized, thereby causing a problem that the manufacturing process is complicated.

SUMMARY OF THE INVENTION

The present invention has been conceived to solve the previously-mentioned problems, and a general object of the present invention is to provide a novel and useful semiconductor integrated device and a manufacturing method thereof.

A more specific object of the present invention is to provide a semiconductor integrated circuit which can be manufactured without the necessity of a new manufacturing apparatus and also without complication of the manufacturing process, and which allows a metal plug to be formed without occurrence of peeling of a metal film; and a manufacturing method thereof.

A second object of the present invention is to provide a semiconductor integrated circuit which can be manufactured without the necessity of a new manufacturing apparatus and also without complication of the manufacturing process, and which can prevent occurrence of an electrical open failure resulting from exposure of a cavity in a metal plug, thereby keeping electrically stable characteristics; and a manufacturing method thereof.

The above objects of the present invention are achieved by a semiconductor integrated circuit having an interconnection structure including a conductive plug passing through insulating films on a substrate. The circuit includes a first insulating film. On the first insulating film is provided a second insulating film. A contact hole is provided so as to pass through the first and second insulating films. A conductive plug is provided in the contact hole. An interconnection layer is provided on the second insulating film in such a manner as to be conducted to the conductive plug. A recess is provided at the upper end surface of the conductive plug contained in the contact hole. The recess depresses the upper end surface of the conductive plug to a position lower than the upper surface of the second insulating film. The thickness of the second insulating film is larger than the depth of said recess.

Above objects of the present invention are also achieved by a semiconductor integrated circuit having an interconnection structure including a conductive plug passing through insulating films on a substrate. The circuit includes a first insulating film. On the first insulating film is provided a second insulating film. A contact hole is provided in such a manner as to pass through the first and second insulating films. A conductive plug is provided in the contact hole. An interconnection layer is provided on the second insulating film in such a manner as to be conducted to the conductive plug. The contact hole is provided in such a manner that the opening diameter of a portion near the opening end of the contact hole becomes larger as nearing the opening end.

Above objects of the present invention are further achieved by a method of manufacturing a semiconductor integrated circuit. The method includes a step of forming a second insulating film on a first insulating film. A contact hole is formed so as to pass through the first and second insulating films. The surface of the second insulating film is etching-back after formation of the contact hole. A conductive film is formed on the inner surface of the contact hole and the surface of the second insulating film after completion of the etching-back. The conductive film is etched-back until the second insulating film is exposed to form a conductive plug in the contact hole. An interconnection layer is formed on the second insulating film in such a manner that the interconnection layer is conducted to the conductive plug.

Other objects and further features of the present invention will be apparent from the following detailed description when read in conjunction with the accompanying drawings.

DESCRIPTION OF THE PREFERRED EMBODIMENTS

Figure 1:
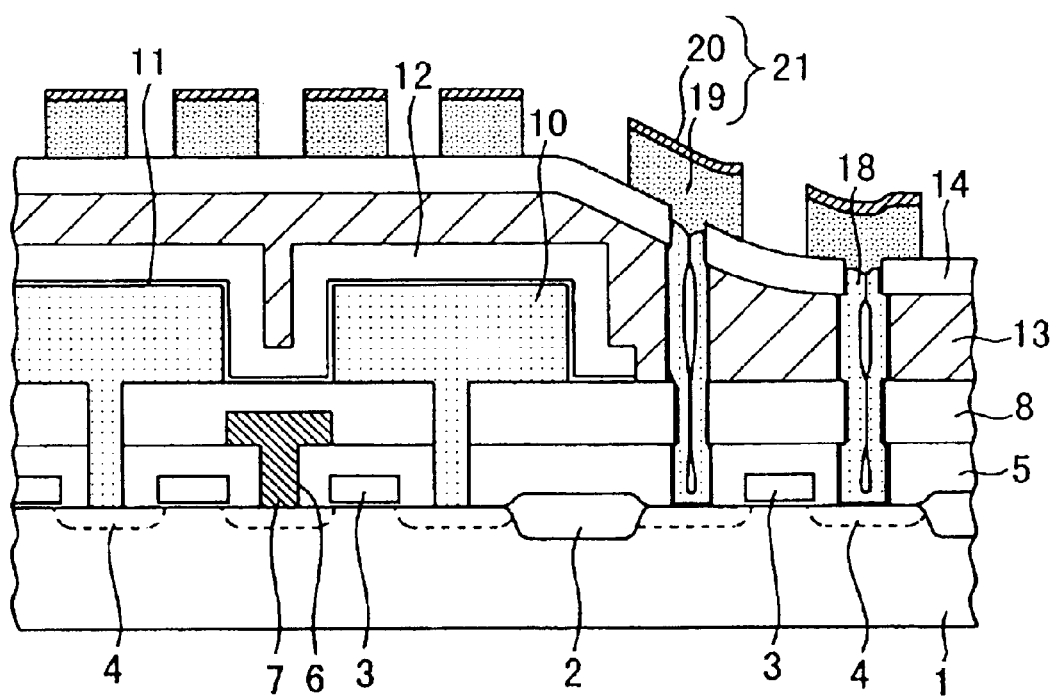
FIG. 1 is a cross-sectional view showing a structure of a semiconductor integrated circuit according to a first embodiment of the present invention.

In the following, principles and embodiments of the present invention will be described with reference to the accompanying drawings. In the figures, like or corresponding parts are designated by like reference numerals and explanation thereof is omitted.

First Embodiment

FIG. 1 is a view showing a cross-sectional structure of a semiconductor integrated circuit according to a first embodiment of the present invention. Referring to FIG. 1, reference numeral 1 designates a semiconductor substrate; 2 is an oxide isolation region; 3 is a gate electrode of a transistor; 4 is a source/drain region of the transistor; 5 is a first interlayer insulating film formed on the semiconductor substrate 1; 6 is a first contact hole opened to the source/drain region 4 of the transistor through the first interlayer insulating film 5; 7 is a first interconnection layer formed on the inner wall of the contact hole 6 and the surface of the first interlayer insulating film 5; and 8 is a second interlayer insulating film formed in such a manner as to cover the first interconnection layer 7 and the surface of the first interlayer insulating film 5.

Referring also to FIG. 1, reference numeral 10 designates a lower electrode for a capacitor (i.e., a storage node); 11 is an insulating film for the capacitor (i.e., a third insulating film); and 12 is an upper electrode for the capacitor (i.e., a cell plate). These elements 10, 11 and 12 constitute the capacitor. Further, reference numeral 13 designates a fourth interlayer insulating film for covering the capacitor and the surface of the second interlayer insulating film 8; 14 is a fifth interlayer insulating film for covering the surface of the fourth interlayer insulating film 13; 18 is a metal plug formed in a contact hole which is opened, through the first, second, fourth and fifth interlayer insulating films 5, 8, 13 and 14, to the source/drain region 4 of a transistor separated from the above transistor by the oxide isolation region 2; and 21 is a second interconnection layer.

Figure 2:
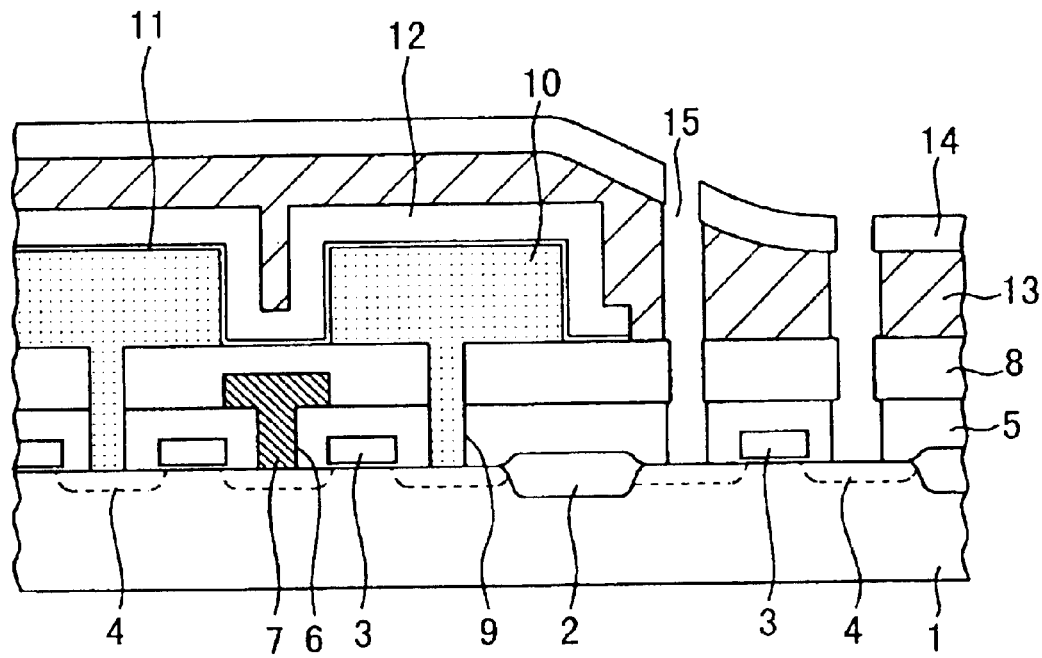
FIGS. 2 and 3 are cross-sectional views for describing a manufacturing method of the semiconductor integrated circuit shown in FIG. 1.
Figure 3:
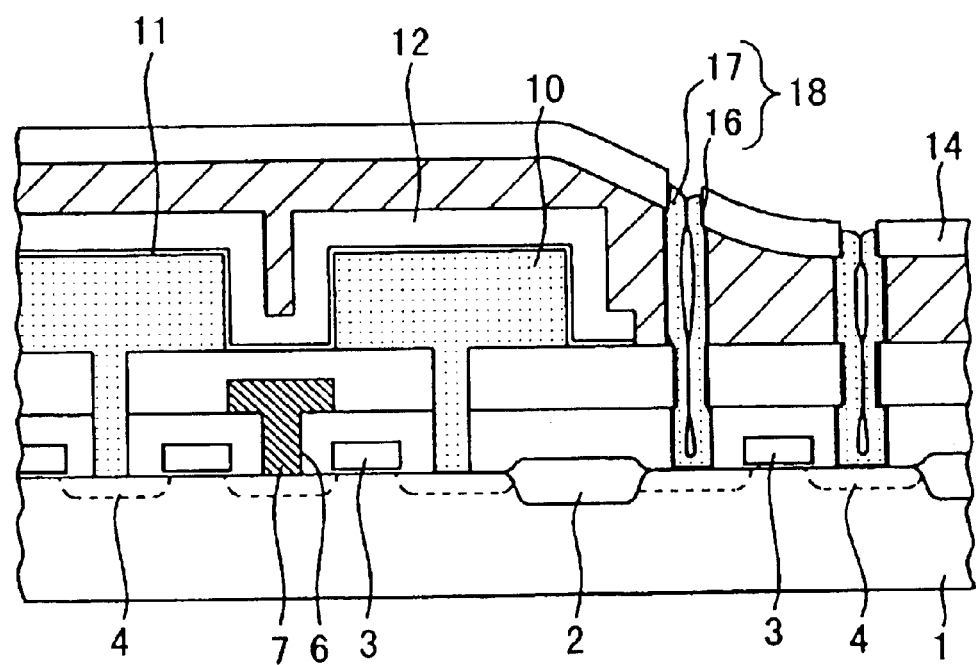

FIGS. 2 and 3 are cross-sectional views illustrating a method of manufacturing a semiconductor integrated circuit according to the first embodiment.

According to the manufacturing method for the first embodiment, oxide isolation regions 2, a gate electrode 3 and source/drain regions 4 of each transistor, and a first interlayer insulating film 5 are formed in or on a semiconductor substrate 1. A first contact hole 6 communicated to one source/drain region 4 is formed in the first interlayer insulating film 5. A metal film is formed on the surface of the first interlayer insulating film 5 in such a manner as to fill the first contact hole 6. The metal film is then patterned by photolithography and etching, to form a first interconnection layer 7.

A second interlayer insulating film 8 is formed in such a manner as to cover the first interconnection layer 7. A second contact hole 9 is formed in the second interlayer insulating film 8 in such a manner as to be opened to the other source/drain region 4 through the second interlayer insulating film 8. A polysilicon layer is formed over the entire surface of the semiconductor substrate 1, and patterned by photolithography and etching to form a storage node 10.

A third insulating film 11 is thinly formed in such a manner as to cover the storage node 10. Then, a polysilicon layer is formed again on the third insulating film 11. The polysilicon layer is patterned by photolithography and etching, to form cell plate 12. The storage node 10, the third insulating film 11, and the cell plate 12 constitute a capacitor functioning as a memory cell.

A fourth interlayer insulating film 13 and a fifth interlayer insulating film 14 are formed on the entire surface of the semiconductor substrate 1 in such a manner as to cover the cell plate 12. The fourth interlayer insulating film 13 is configured as a BPSG film allowed to be easily planarized in order to reduce a stepped portion between a memory cell region and a peripheral circuit region on the wafer. The fifth interlayer insulating film 14 is formed for protecting the fourth interlayer insulating film 13 and also improving the adhesion with a resist pattern. In the first embodiment, the fifth interlayer insulating film 14 has a thickness $t_{14}$ larger than the depth "h" of a recess of a metal plug to be formed later. To be more specific, the depth "h" of the recess is generally in a range of several tens nm to several hundreds nm, while the thickness $t_{14}$ of the fifth interlayer insulating film 14 is set at a value being about 1.2 times to several times the value of the depth "h".

The first, second, fourth and fifth interlayer insulating films 5, 8, 13 and 14 are selectively removed by photolithography and etching, to form a third contact hole 15 which is opened through the above films to the source/drain region 4 of a transistor separated from the above transistor by the oxide isolation region 2. Then, the semiconductor substrate 1 is subjected to wet cleaning using a $NH_4OH/H_2O_2$ solution for removing foreign matters remaining on the wafer surface.

The fourth interlayer insulating film 13 containing B and P is etched at an etching rate larger than that of the fifth interlayer insulating film 14. Accordingly, by the above-described wet cleaning, irregularities corresponding to the kinds of the interlayer insulating films are formed on the inner wall of the third contact hole 15. The structure shown in FIG. 2 is obtained by performing the above-described sequential steps.

Referring to FIG. 3, a first high melting point metal film 16 is formed by sputtering in such a manner as to cover the inner wall of the third contact hole 15 and the surface of the fifth interlayer insulating film 14. Then a second high melting point metal film 17 is formed on the first high melting point metal film 16 by CVD. The first and second high melting point metal films 16 and 17 are etched-back by RIE until the fifth interlayer insulating film 14 is exposed, to form a metal plug 18 composed of the first and second high melting point metal films 16 and 17 in the third contact hole 15. Each of the first and second high melting point metal films 16 and 17 may be made from Ti or W, or a nitride or silicate thereof.

Figure 4:
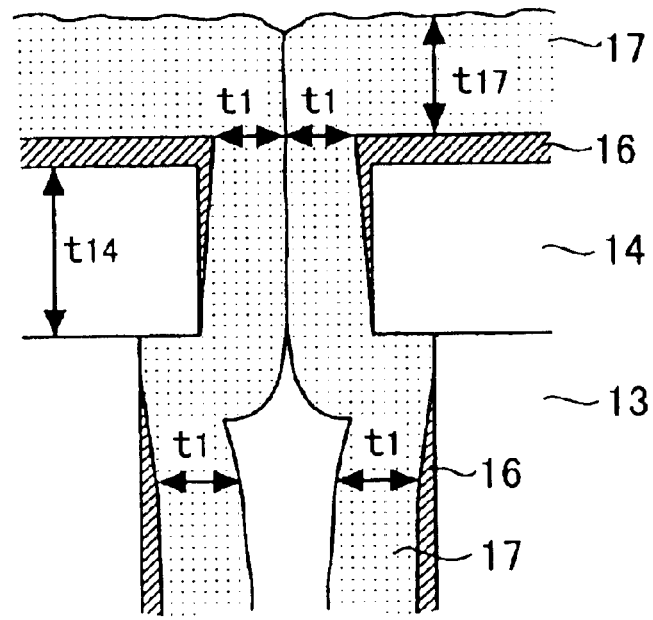
FIGS. 4 and 5 are enlarged cross-sectional views of an opening end portion of a contact hole for describing the manufacturing method of the semiconductor integrated circuit shown in FIG. 1.
Figure 5:
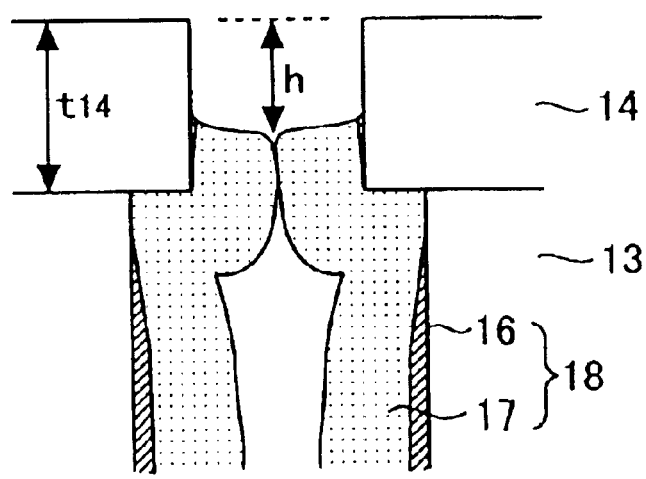

FIGS. 4 and 5 are views each showing, on a large scale, an opening end portion of the third contact hole 15. Specifically, FIG. 4 shows a state right after the second high melting point metal film 17 is formed subsequently to formation of the first high melting point metal film 16. FIG. 5 shows a state after the first and second high melting point metal films 16 and 17 are etched-back.

As shown in FIG. 4, at the opening end portion of the third contact hole 15, a diameter of the opening formed in the fourth interlayer insulating film 13 is larger than a diameter ($2t_1$) of the opening formed in the fifth interlayer insulating film 14. In other words, at the opening end portion of the third contact hole 15, the fifth interlayer insulating film 14 is protruded from the wall surface of the fourth interlayer insulating film 13 by a specific length.

Upon formation of the second high melting point metal film 17 under such a situation, when the thickness of the second high melting point metal film 17 reaches the value $t_1$, the opening end portion of the third contact hole 15 is blocked, and thereafter, the growth of the second high melting point metal film 17 proceeds not in the third contact hole 15 but only on the flat portion on the substrate. When the thickness of the second high melting point metal film 17 on the flat portion on the substrate reaches the normal value $t_{17}$ ($>t_1$), a cavity is formed in the third contact hole 15. In the first embodiment, however, the cavity is not formed in a region shallower than a depth of $t_{14}$ from the surface of the fifth interlayer insulating film 14, that is, in the region shallower than the bottom surface of the fifth interlayer insulating film 14.

The first and second high melting point metal films 16 and 17 on the fifth interlayer insulating film 14 are removed by overall etching-back, to form the metal plug 18 in the third contact hole 15 as shown in FIG. 5. At this time, the surface of the metal plug 18 is retreated by over-etching from the surface of the fifth interlayer insulating film 14 by the depth "h", so as to form a recess. In the first embodiment, since the thickness $t_{14}$ of the fifth interlayer insulating film 14 is set to be larger than the depth "h" of the recess, the cavity in the third contact hole 15 is not exposed by the above-described etching-back.

Referring again to FIG. 1, after formation of the metal plug 18, a metal film 19 is formed in such a manner as to cover the fifth interlayer insulating film 14 and the metal plug 18. The metal film 19 is usually made from an aluminum alloy such as AlSi, AlSiCu or AlCu. Such an aluminum alloy having a high reflectance is easy to cause halation upon photolithography, and therefore, an anti-reflection film 20 is formed on the metal film 19. The anti-reflection film 20 is generally made from a high melting point metal such as TiW, WSi, MoSi, TiW or W, or a compound thereof. The anti-reflection film 20 plays a role of not only reducing the reflectance of the surface of the metal film 19 but also reinforcing the mechanical strength of the metal film 19 thereby enhancing the reliability of the device.

The metal film 19 and the anti-reflection film 20 are patterned by photolithography and etching, to form a second interconnection layer 21. After formation of the second interconnection layer 21, the semiconductor substrate is subjected to cleaning treatment using a solvent containing ammonium fluoride or an amine based solvent.

As described above, in the first embodiment, the metal plug 18 can be formed without exposure of the inner cavity of the third contact hole 15. Accordingly, even if the above-described cleaning is performed after formation of the second interconnection layer 21, the solvent used for the cleaning does not permeate in the inner cavity of the third contact hole 15. As a result, according to the semiconductor integrated circuit, it is possible to prevent corrosion of the metal plug 18 by the solvent, and hence to keep electrically stable characteristics.

Second Embodiment

A second embodiment of the present invention will be described below with reference to FIGS. 6 to 9.

Figure 6:
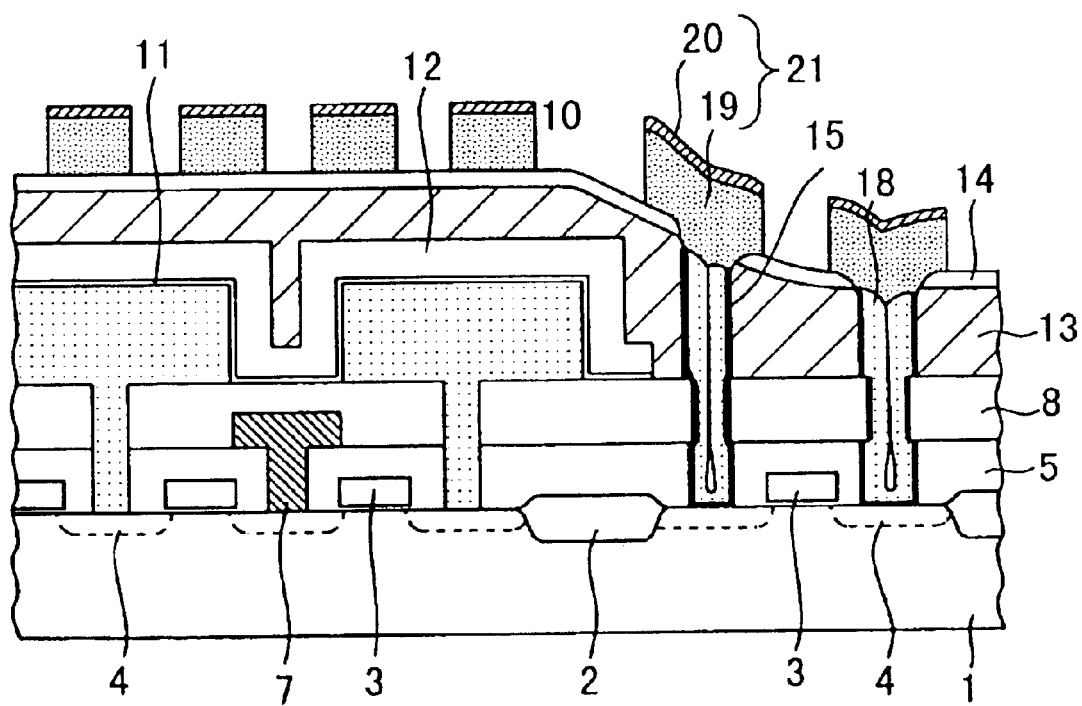
FIG. 6 is a cross-sectional view showing a structure of a semiconductor integrated circuit according to a second embodiment of the present invention.

FIG. 6 is a view showing a cross-sectional structure of a semiconductor integrated circuit according to a second embodiment of the present invention. Like the circuit described in the first embodiment, the semiconductor integrated circuit in the second embodiment includes a third contact hole 15 passing through a fifth interlayer insulating film 14 and a fourth interlayer insulating film 13, as well as a metal plug 18 formed in the third contact hole 15. Even in the second embodiment, a diameter of the opening formed in the fifth interlayer insulating film 14 is larger than a diameter of the opening formed in the fourth interlayer insulating film 13. Further, in the second embodiment, the metal plug 18 ensures its double layer structure over the entire region of the inner wall of the third contact hole 15.

According to the manufacturing method for a semiconductor integrated circuit in the second embodiment, the same procedure as that in the first embodiment is carried out until the state shown in FIG. 2 is obtained. The manufacturing steps carried out after formation of the state shown in FIG. 2 will be described with reference to FIGS. 7 to 9.

Figure 7:
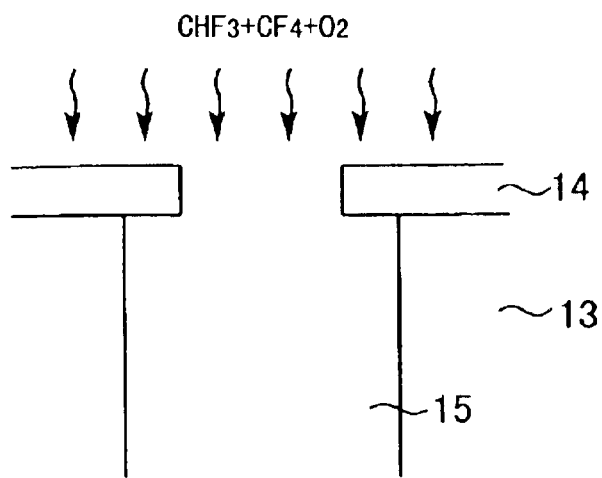
FIGS. 7 to 9 are enlarged cross-sectional views of an opening end portion of a contact hole for describing a manufacturing method of the semiconductor integrated circuit shown in FIG. 6.
Figure 8:
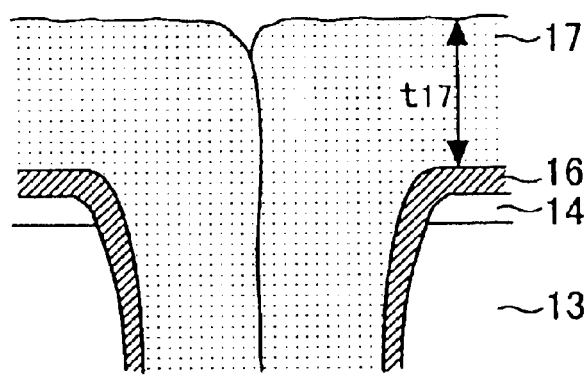
Figure 9:
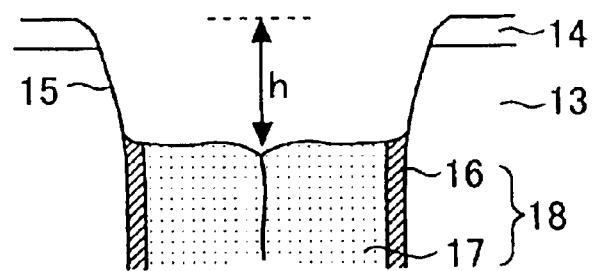
Figure 10:
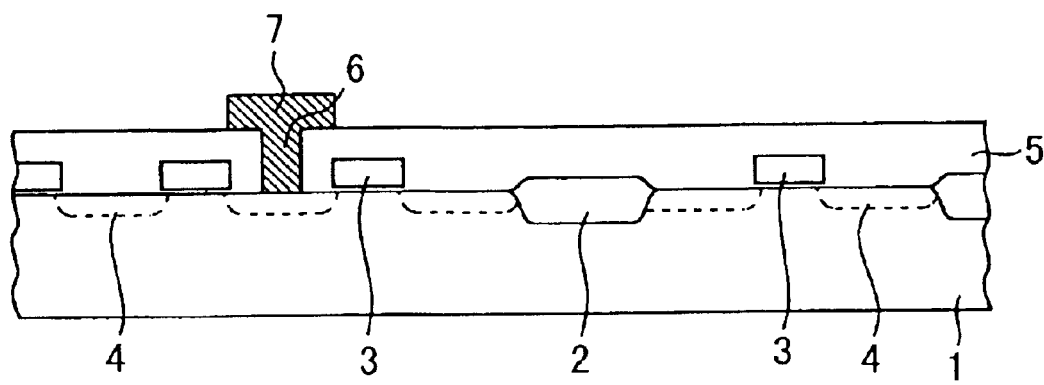
FIGS. 10 to 13 and 16 are cross-sectional views for describing a manufacturing method of a former semiconductor integrated circuit.
Figure 11:
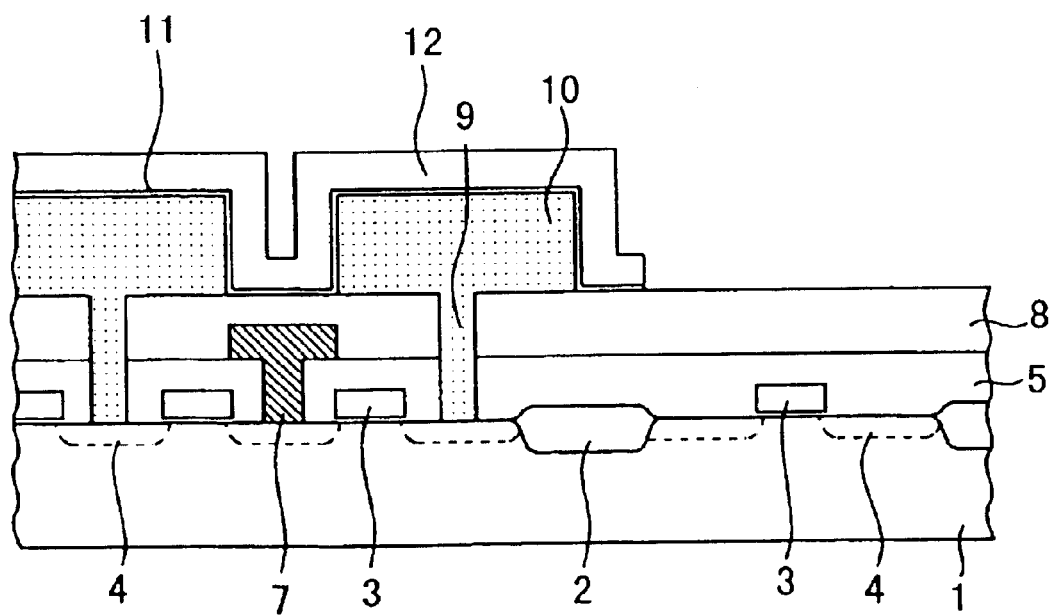
Figure 12:
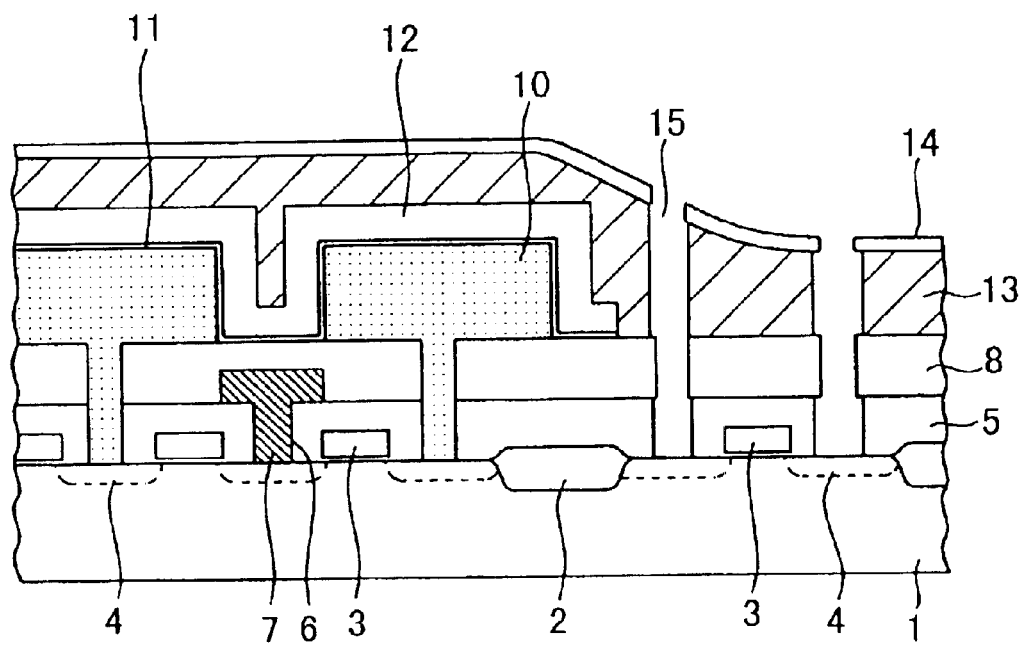
Figure 13:
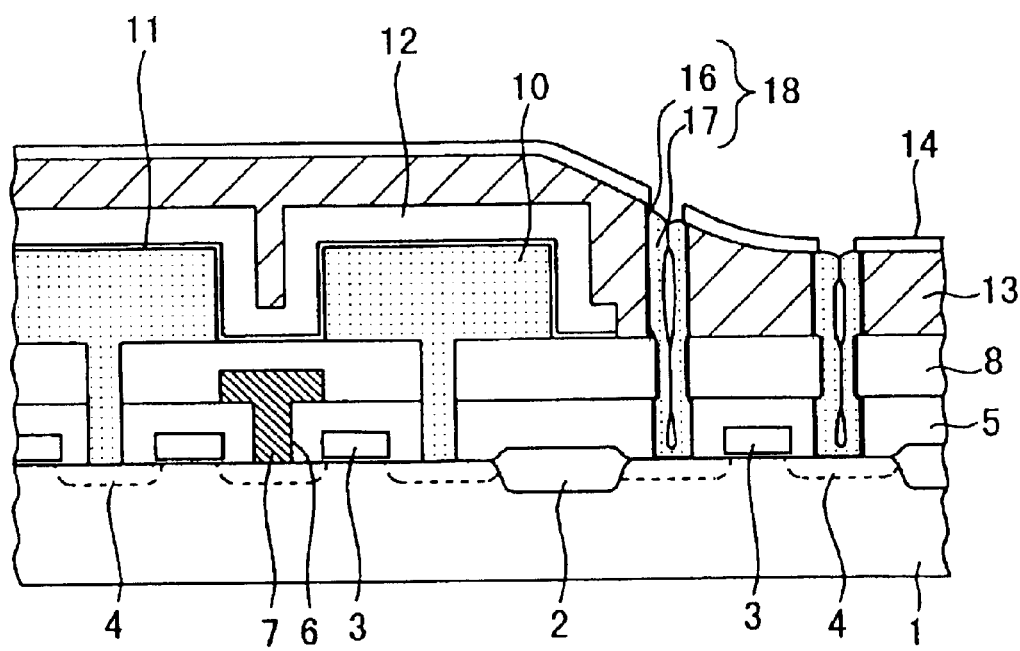
Figure 14:
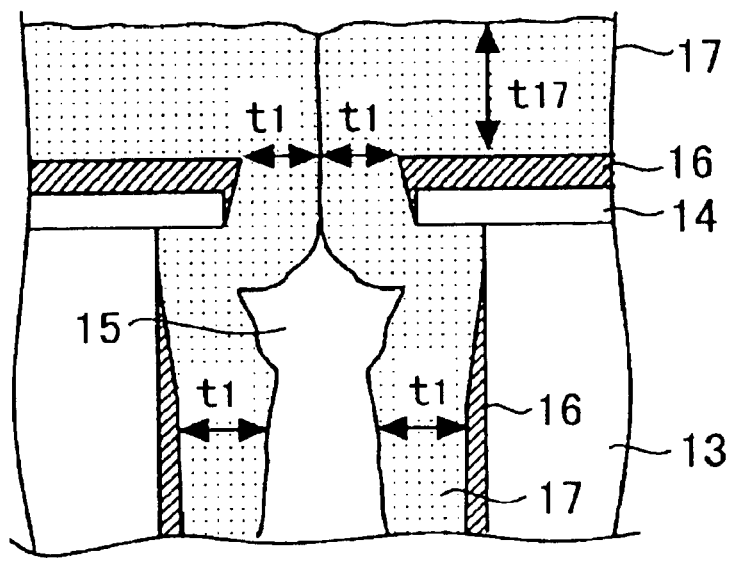
FIGS. 14 and 15 are enlarged cross-sectional views of an opening end portion of a contact hole for describing a manufacturing method of the former semiconductor integrated circuit.
Figure 15:
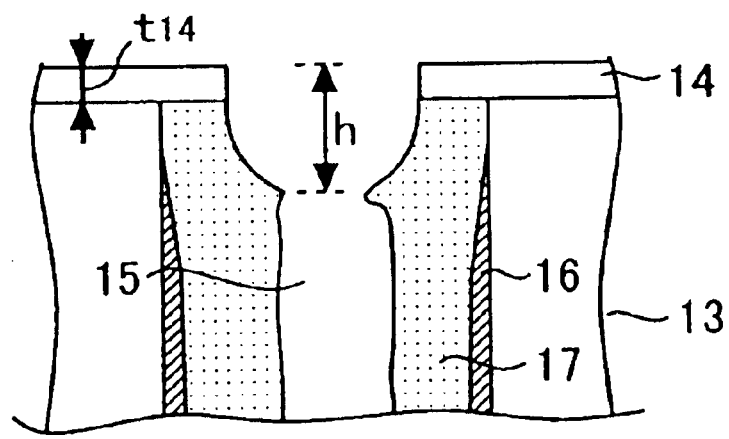
Figure 16:
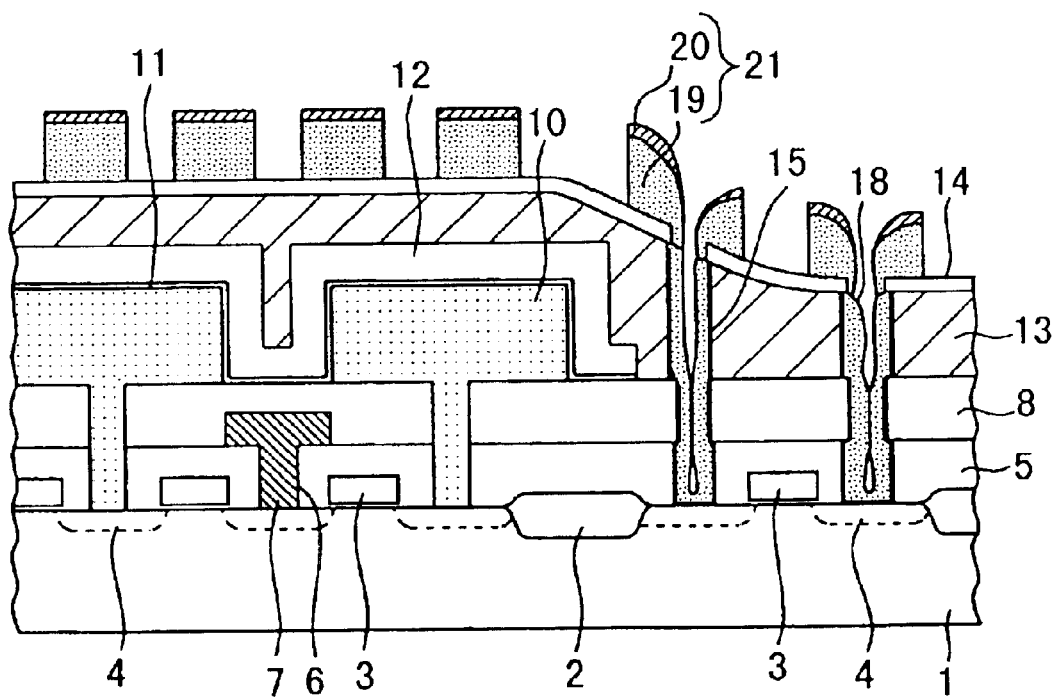

FIGS. 7 to 9 are views each showing, on a large scale, an opening end portion of the third contact hole 15. Specifically, FIG. 7 shows a state right after cleaning treatment is carried out subsequently to formation of the third contact hole 15; FIG. 8 shows a state right after a second high melting point metal film 17 is formed subsequently to formation of a first high melting point metal film 16; and FIG. 9 shows a state after the first and second high melting point metal films 16 and 17 are etched-back.

As shown in FIG. 7, in the second embodiment, overall etching-back using a gas containing a mixed gas of ($CHF_3$+ $CF_4$+$O_2$) is carried out. In general, upon dry etching, an etching rate for a corner portion is larger than that for a flat portion. Accordingly, when the etching-back is carried out after the third contact hole 15 is formed, the corner of the contact hole 15 is preferentially etched, so that the protruded portion of the fifth interlayer insulating film 14 is rounded. The roundness of the protruded portion of the fifth interlayer insulating film 14 is dependent on the etching-back amount. For example, by setting the etching-back amount at a value ranging from several tens nm to several hundreds nm, the protruded portion of the fifth interlayer insulating film 14 can be perfectly removed.

After termination of the etching-back, as shown in FIG. 8, the first high melting point metal film 16 is formed over the entire surface of the wafer by sputtering. At this time, since the protruded portion of the fifth interlayer insulating film 14 has been removed and the opening end portion of the third contact hole 15 has been rounded, that is, the third contact hole 15 has been formed such that the opening diameter becomes larger as nearing the opening end portion, the first high melting point metal film 16 is formed over the entire inner surface of the third contact hole 15 with a desirable coverage.

The second high melting point metal film 17 is formed on the first high melting point metal film 16 by CVD. In the second embodiment, since the opening end portion of the third contact hole 15 ensures the opening diameter larger than that of the inner portion of the third contact hole 15, the opening end portion of the third contact hole 15 is not blocked with the second high melting point metal film 17 before the interior of the third contact hole 15 is filled therewith. As a result, according to the structure of the second embodiment, the second high melting point metal film 17 can be deposited on the first high melting point metal film 16 without occurrence of a large cavity in the third contact hole 15.

As shown in FIG. 9, the first and second high melting point metal films 16 and 17 is etched-back until the surface of the fifth interlayer insulating film 14 is exposed, whereby the metal plug 18 is formed in the third contact hole 15. At this time, the recess having the depth "h" is formed in the metal plug 18 by over-etching; however, since the interior of the third contact hole 15 is filled with the second high melting point metal film 17 without remaining any space, the cavity is not exposed irrespective of formation of the recess. After formation of the metal plug 18, a second interconnection layer 21 is formed in the same procedure as that in the first embodiment (see FIG. 6).

As described above, according to the second embodiment, since the first high melting point metal film 16 is formed over the entire inner surface of the third contact hole 15 with a desirable coverage, the double layer structure of the metal plug 18, composed of the first and second high melting point metal films 16 and 17, extends over the entire inner surface of the third opening contact 15. This makes it possible to effectively suppress peeling of the film due to a stress at the subsequent steps and hence to ensure a desirable yield.

Further, in the second embodiment, since the cavity is not exposed to the surface of the metal plug 18, even if the cleaning is performed after formation of the second interconnection layer 21, the solvent used for the cleaning does not permeate in the inner portion of the third contact hole 15. As a result, according to the structure in the second embodiment, it is possible to keep electrically stable characteristics and hence to realize a high reliability of the device.

The major benefits of the present invention described above are summarized as follows:

According to the first aspect of the present invention, since the thickness of the second insulating film is larger than the depth of the recess formed at the upper end of the conductive plug, a region lower than the bottom surface of the second insulating film is not exposed in the recess. Accordingly, even if the cavity is formed in the contact hole, it is not exposed to the surface of the second insulating film. This makes it possible to realize a semiconductor integrated circuit with a high reliability.

According to the second aspect of the present invention, since the contact hole can be formed into a shape that the opening diameter of a portion near the opening end of the contact hole becomes larger as nearing the opening end, the conductive plug exhibiting a desirable coverage can be easily formed in the contact hole. As a result, according to the present invention, it is possible to prevent occurrence of the cavity in the contact hole and hence to realize a semiconductor integrated circuit with a high reliability.

According to the third aspect of the present invention, since the first insulating film contains at least one of boron and phosphorus, it exhibits a desirable planarization characteristic. Further, since the second insulating film contains neither boron nor phosphorus, it can play a role of protecting the first insulating film and also improving the adhesion with a resist pattern.

According to the fourth aspect of the present invention, since the conductive plug contains tungsten, it is possible to realize an interconnection structure with a low resistance.

According to the fifth aspect of the present invention, since the conductive plug has a double layer structure, it exhibits characteristics variable depending on various requirements. Further, according to the present invention, since the conductive plug has a desirable coverage, it is possible to eliminate the possibility that the double layer structure of the conductive plug locally becomes a single layer structure, and hence to effectively prevent occurrence of an inconvenience such as peeling of a film.

Further, the present invention is not limited to these embodiments, but variations and modifications may be made without departing from the scope of the present invention.

The entire disclosure of Japanese Patent Application No. Hei 11-162831 filed on Jun. 9, 1999 including specification, claims, drawings and summary are incorporated herein by reference in its entirety.

What is claimed is:

1. A semiconductor integrated circuit having an interconnection structure including conductive plug passing through insulating films on a substrate, said circuit comprising:

a first insulating film;

a second insulating film provided on said first insulating film;

a contact hole provided in such a manner as to pass through said first and second insulating films;

a conductive plug provided in said contact hole, said conductive plug having a cavity formed under the bottom surface of said second insulating film;

an interconnection layer provided on said second insulating film in such a manner as to be conducted to said conductive plug; and a recess provided at the upper end surface of said conductive plug contained in said contact hole, said recess depressing the upper end surface of said conductive plug to a position lower than the upper surface of said second insulating film;

wherein the thickness of said second insulating film is larger than the depth of said recess.

2. The semiconductor integrated circuit according to claim 1, wherein said first insulating film contains at least one of boron (B) or phosphorus (P); and said second insulating film contains neither boron nor phosphorus.

3. The semiconductor integrated circuit according to claim 1, wherein said conductive plug contains tungsten (W).

4. The semiconductor integrated circuit according to claim 2, wherein said conductive plug contains tungsten (W).

5. A semiconductor integrated circuit having an interconnection structure including a conductive plug passing through insulating films on a substrate, said circuit comprising:

a first insulating film;

a second insulating film provided on said first insulating film;

a contact hole provided in such a manner as to pass through said first and second insulating films and provided in such a manner that a diameter of the opening formed in said first insulating film is larger than a diameter of the opening formed in said second insulating film;

a conductive plug provided in said contact hole;

an interconnection layer provided on said second insulating film in such a manner as to be conducted to said conductive plug; and a recess provided at the upper end surface of said conductive plug contained in said contact hole, said recess depressing the upper end surface of said conductive plug to a position lower than the upper surface of said second insulating film;

wherein the thickness of said second insulating film is larger than the depth of said recess.

* * * * *